United States Patent [19]

Hirai

[11] Patent Number: 4,904,946
[45] Date of Patent: Feb. 27, 1990

[54] METHOD FOR EVALUATING INSULATING FILMS

[75] Inventor: Yoshio Hirai, Tokyo, Japan

[73] Assignee: Seiko Instruments Inc., Japan

[21] Appl. No.: 268,678

[22] Filed: Nov. 7, 1988

Related U.S. Application Data

[63] Continuation of Ser. No. 913,686, Sep. 30, 1986, abandoned.

[30] Foreign Application Priority Data

Oct. 2, 1985 [JP] Japan ................................ 60-219848

[51] Int. Cl.[4] ............................................ G01R 27/02
[52] U.S. Cl. ...................................... 324/551; 324/554
[58] Field of Search ................ 324/548, 551, 554, 552

[56] References Cited

U.S. PATENT DOCUMENTS

| | | | |
|---|---|---|---|
| 3,125,720 | 3/1964 | Swift | 324/548 |
| 3,727,129 | 4/1973 | Hummert | 324/558 X |
| 4,336,494 | 6/1982 | Shindo et al. | 324/551 X |
| 4,360,774 | 11/1982 | Crytzer | 324/554 |
| 4,810,972 | 3/1989 | Appleby, Jr. et al. | 324/551 |

OTHER PUBLICATIONS

"Time-Zero Dielectric Reliability Test By a Ramp Method" IEEE/IRPS, 1981, by Arnold Berman, pp. 204-209.
"Method of Determining Reliability Screens For Time Dependent Dielectric Breakdown", IEEE/IRPS, 1979, by Dwight L. Crook, pp. 1-7.
"IBM Technical Disclosure Bulletin", vol. 28, No. 5, Oct. 1985.
"IEEE 17th Annual Proceedings Reliability Physics", San Francisco, Calif., 1979, pp. 8-12, Low Field Time Dependent Dielectric Integrity.

Primary Examiner—A. D. Pellinen
Assistant Examiner—Jeffrey A. Gaffin
Attorney, Agent, or Firm—Bruce L. Adams; Van C. Wilks

[57] ABSTRACT

A test method is used for examining a sample insulating film to determine an expected value of time for the sample insulating film to undergo dielectric breakdown. A varying electric stress is applied to a sample insulating film to flow therethrough a varying electric current. The varying electric current is monitored until catastrophic dielectric breakdown occurs in the sample insulating film to measure a critical electric current which flows through the sample insulating film immediately before the breakdown occurs. The expected value of time to breakdown is determined according to the measured critical electric current.

10 Claims, 3 Drawing Sheets

(a)

(b)

(a)

(b)

METHOD FOR EVALUATING INSULATING FILMS

This is a continuation of application Ser. No. 913,686, filed September 30, 1986 which is now abandoned.

BACKGROUND OF THE INVENTION

The present invention relates to a new method for evaluating insulating films by forcibly flowing an electric current through an insulating film to easily measure or estimate a time until the insulating film is broken down.

1. Field of the invention

The present invention relates to a method for evaluating insulating films according to a distribution of breakdown current densities of an insulating film. This method is as simple as the conventional method of finding a distribution of insulating strength, and yet makes it possible to evaluate the film quality of the insulating film more accurately than the conventional method for of finding the distribution of insulating strength. Further, this method has a close correlation to the constant-current TDDB of Time Dependent Dielectric Breakdown, and makes it possible to accurately estimate a breakdown time of the insulating film without a long period of time to measure.

2. Description of the Prior Art

Conventional typical technique for evaluating insulating films includes a voltage ramping method and a TDDB method. According to the voltage ramping method, a voltage applied to the film is gradually increased in order to measure a voltage or an electric field when a current has exceeded a predetermined value. According to the TDDB method, a constant voltage is continuously applied to an insulating film or a constant current is continuously supplied into the insulating film to measure a time until the insulating film is broken down.

The above conventional methods are disclosed in the following papers:
- A. Berman, "Time-zero dielectric reliability test by a ramp method," IEEE/IRPS, pp 204–209, 1981
- D. L. Crook, "Method of determining reliability screens for time dependent dielectric breakdown," IEEE/IRPS, pp 1–7, 1979

In the conventional ramping method, there are such problems as follows; Progress in the materials and equipment in recent years has contributed to improve the quality of insulating films so that pinholes and weak spots are contained in small amounts. Therefore, the voltage ramping method is no longer capable of obtaining good results, and it is becoming difficult to evaluate the film qualities minutely.

FIG. 3 illustrates distributions of insulating strength of $SiO_2$ films having thicknesses of 100 to 220 angstroms. Though these films have different qualities which were produced by different heat treatment, hardly any difference between them can be recognized from FIG. 3.

The TDDB method, on the other hand, is effective to evaluate the quality and reliability of the insulating films, but requires a long period of time since the time must be measured until the film is broken down.

FIG. 4 illustrates the distribution of insulating strength of $SiO_2$ films according to the TDDB method, and evident differences can be recognized from FIG. 4. Moreover, since a number of specimens must be measured to find statistical results, a greatly extended period of time is required using the TDDB method.

In recent years, a constant-voltage TDDB method has been introduced which is capable of measuring many points or spots simultaneously. However, this method is not able to detect the total amount of electric charge that flows through the film. A constant-current TDDB method, on the other hand, is capable of easily detecting the total amount of electric charge, but is quite difficult to simultaneously measure a number of points. Therefore, this method requires a greatly extended period of time.

SUMMARY OF THE INVENTION

An object of the present invention is to provide a method for evaluating insulating films which easily measure or predict a time until an insulating film is broken down.

Another object of the present invention is to provide a method for evaluating insulating films with a high resolution.

In order to achieve the above objects, method according to the the present invention evaluates the insulating film based on the distribution of breakdown current densities, which has an intimate correlation to the constant-current TDDB, and requires simple measurement.

DETAILED DESCRIPTION OF THE PREFERRED EMBODIMENT

Figure 1:
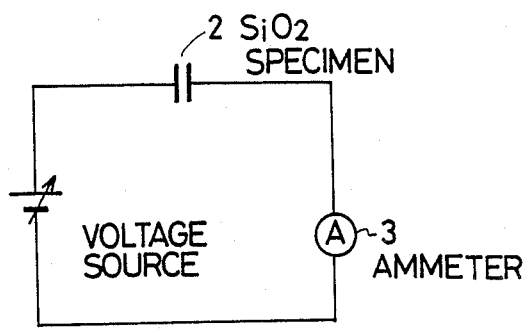
FIGS. 1(a) and 1(b) are diagrams illustrating the principle of a voltage ramping method according to the present invention.
Figure 1:
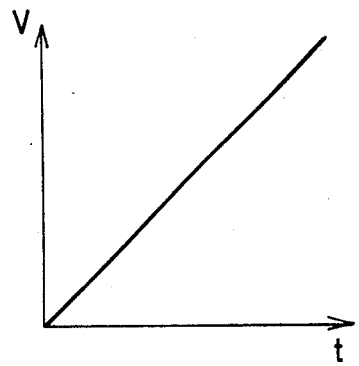

FIGS. 1(a), 1(b), 2(a) and 2(b) illustrate the measuring principle of breakdown current density according to the present invention. FIGS. 1(a) and 1(b) illustrate a voltage ramping method similar to the conventional insulating strength testing method. When this test method is to be carried out, a sample insulating film in the form of an $SiO_2$ specimen 2 is connected to a voltage source and to an ammeter 3 as shown in a circuit diagram of FIG. 1(a). In the case of the voltage ramping method, a varying electric stress in the form of a lineally ramping voltage is applied to the sample insulating film 2 as shown in FIG. 1(b), and a current that flows through the insulating film 2 is monitored, by the ammeter 3 the current just or immediately before it increases abruptly as a result of rupture or breakdown of the film is detected as a breakdown or critical current. Generally, the breakdown current is normalized into a current density by effective area of an electrode, and a number of current densities at different spots are measured to find a distribution thereof.

Figure 2:
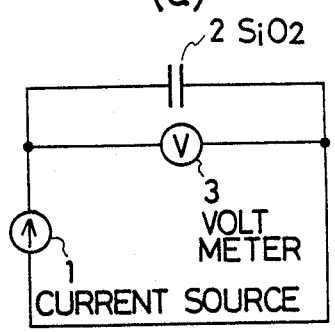
FIGS. 2(a) and 2(b) are diagrams illustrating the principle of a current ramping method according to the present invention.
Figure 2:
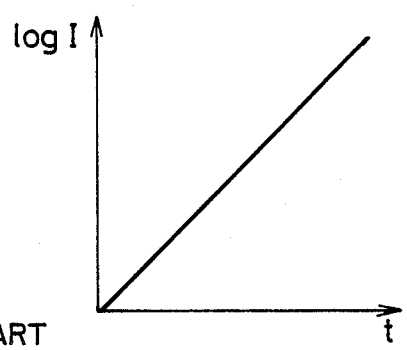

FIGS. 2(a) and 2(b) illustrate the current ramping method, wherein FIG. 2(a) shows a circuit therefor. In this case, the voltage of the insulating film 2 is monitored by a volt meter 3 while maintaining the logarithmic change of current with the lapse of time as shown in FIG. 2(b) a distribution of breakdown current is found by detecting the breakdown currents just before the monitored voltage decreases suddenly.

Figure 3:
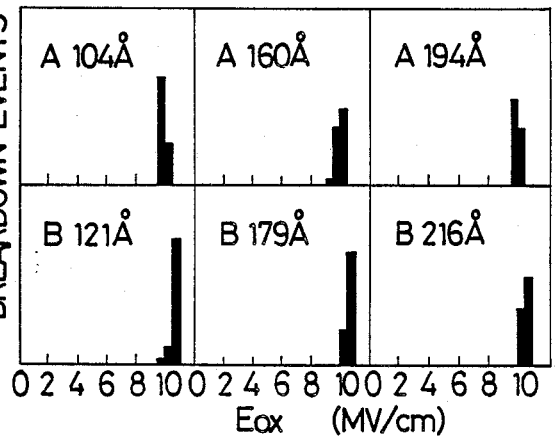
FIG. 3 is a diagram showing distributions of insulating strength according to a conventional voltage ramping method.
Figure 4:
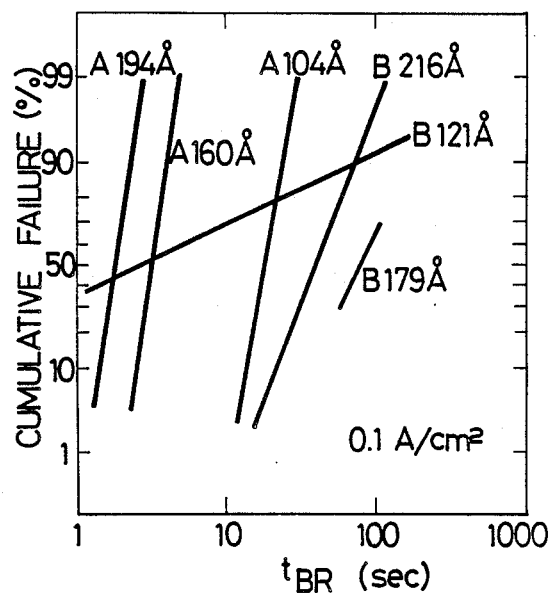
FIG. 4 is a diagram showing distributions of insulating strength according to a conventional constant-current TDDB method.
Figure 5:
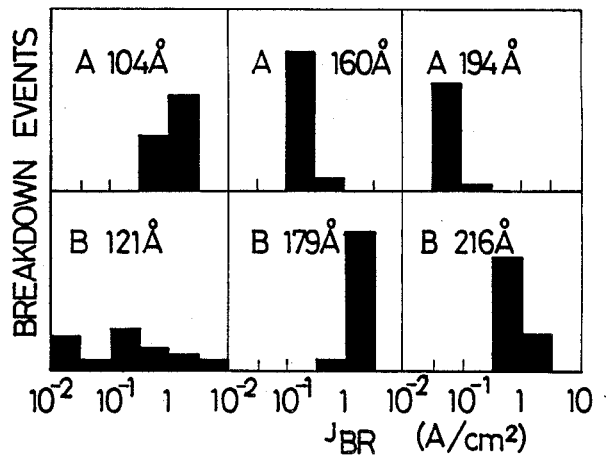
FIG. 5 is a diagram showing distributions of breakdown current densities according to the method of the present invention.

FIG. 5 illustrates examples of the thus found statistical distributions of breakdown current densities. The having the thickness from 100 to 220 angstroms $SiO_2$ specimens were measured on the same silicon wafer as that used for finding the distributions of insulating strength of FIG. 3. In FIG. 5, the abscissa represents the density of breakdown current and the ordinate represents the frequency of breakdown events. Symbols A and B represent differences in the thermal history of the silicon wafer before $SiO_2$ is formed. FIG. 5 clearly indicates the difference in the film qualities that could not be recognized by the conventional voltage ramping method of FIG. 3. FIG. 5 indicates the film characteristic similar to the characteristic of FIG. 4 such as the difference in the thermal histories A and B, the dependency upon the film thickness, and abnormal distributions in and case of the specimen B having the thickness of 121 Å. It will be understood from FIGS. 4 and 5 that to find the distributions of breakdown current densities is as the easy as conventional voltage ramping method, and yet makes it possible to more minutely evaluate the film qualities than the conventional voltage ramping method.

Figure 6:
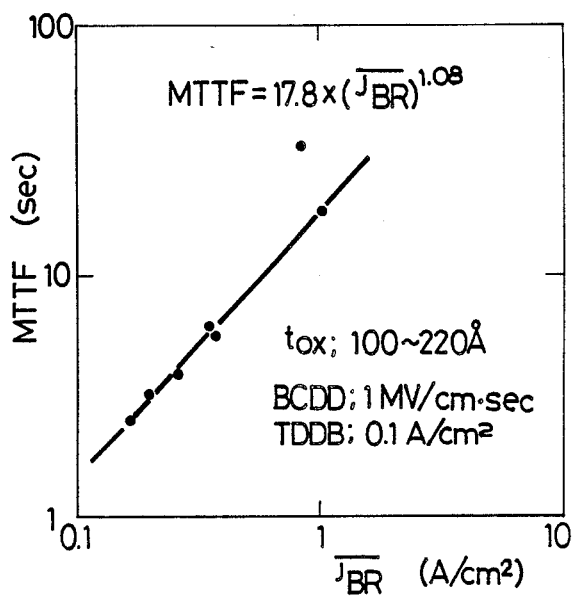
FIG. 6 is a diagram showing a correlation between the distributions of breakdown current densities according to the present invention and the constant-current TDDB according to the conventional method.

In order to predict a breakdown, time or time to breakdown which is the most effective characteristic for evaluating insulating films, it is necessary to convert the breakdown current densities into the breakdown time. The conversion is carried out by use of a correlation between an MTTF (mean time to failure in the term of breakdown) of the constant-current TDDB and an average value of distributions of the breakdown current densities of $SiO_2$ films formed on the same silicon wafer. FIG. 6 shows the correlation. The constant-current TDDB was measured under a condition of 0.1 $mA/cm^2$, and the distribution of breakdown current densities was measured by the voltage ramping method under a condition of 1 MV/cm-sec. These two values show a very intimate correlation which is given by $$MTTF = 17.8 \times (\overline{J_{BR}})^{1.08} \qquad (1)$$

where $\overline{J_{BR}}$ represents a mean value of the distribution of breakdown current densities.

The equation (1) represents a correlation between the TDDB and a mean value of the distributions of breakdown current densities. Both of them are based upon the breakdown testing, and it is not possible to conduct these measurements using the same specimen. However, if it were possible, these measurements would correspond to each other in a one-to-one manner. Accordingly, the equation (1) can be written as, $$TTF = 17.8 \times (J_{BR})^{1.08} \qquad (2)$$

where TTF represents the time until the breakdown takes place.

Figure 7:
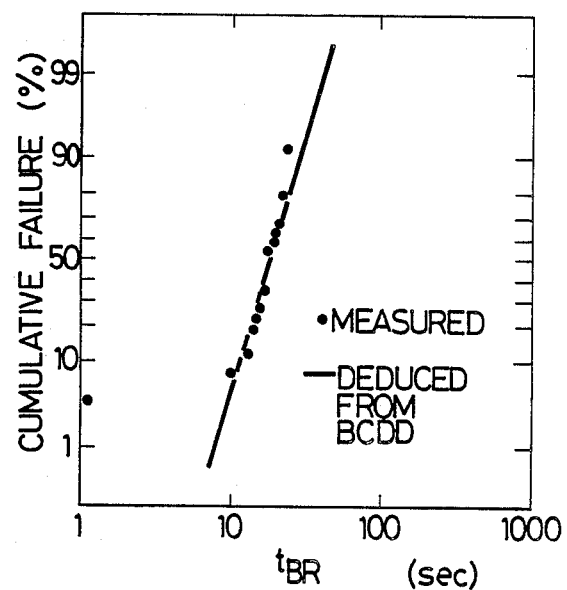
FIG. 7 is a diagram showing a constant-current TDDB expected from the distributions of breakdown current densities by the present invention in comparison with the practically measured constant-current TDDB.

A value of 17.8 in the equations (1) and (2) is determined depending upon the conditions of these measurements. FIG. 7 shows the constant-current TDDB expected from the distribution of breakdown current densities in accordance with the equation (2) in comparison with the practical constant-current TDDB, wherein dots represent practically measured values and line represents values expected from the distributions of breakdown current densities. These values are in good agreement. Namely, to find the distribution of breakdown current densities makes it possible to estimate the breakdown time which helps minutely evaluate the quality and reliability of the insulating film, without requiring extended periods of time unlike the constant-current TDDB method.

As described above, to find the distribution of breakdown current densities according to the present invention makes it possible to simply and minutely evaluate the film quality of the insulating film.

What is claimed is:

1. A method of evaluating the insulating properties of an insulating film comprising the steps of:
    (a) measuring breakdown currents of the insulating film, the breakdown currents being measured just before the insulating film undergoes catastrophic breakdown;
    (b) determining the distribution of breakdown current densities;
    (c) obtaining a correlation between the mean value of the breakdown current densities and the mean time to failure of a constant-current Time Dependent Dielectric Breakdown; and
    (d) finding an expected breakdown time and the distribution of Time Dependent Dielectric Breakdown of the insulating films according to the correlation.

2. A test method of examining a sample insulating film to determine the expected value of time for the sample insulating film to undergo dielectric breakdown, the test method comprising the steps of: applying a varying electric stress to a sample insulating film to flow therethrough a varying electric current to cause the sample insulating film to undergo catastrophic breakdown; monitoring the varying electric current to detect when the sample insulating film undergoes catastrophic breakdown and measuring a critical electric current which flows through the sample insulating film immediately before the catastrophic breakdown occurs; and determining the expected value of time for the sample insulating film to undergo breakdown based on the measured critical electric current.

3. A test method according to claim 2; wherein the step of applying comprises applying a ramping voltage across the sample insulating film.

4. A test method according to claim 3; wherein the step of applying comprises applying a linear ramping voltage across the sample insulating film.

5. A test method according to claim 2; wherein the step of applying includes flowing a ramping electric current through the sample insulating film.

6. A test method according to claim 5; wherein the step of applying includes flowing a logarithmic ramping electric current through the sample insulating film.

7. A test method according to claim 2; wherein the step of monitoring includes monitoring a varying electric current flowing through a spot having a given area in the sample insulating film to measure a critical electric current flowing through the spot to thereby obtain a critical electric current density by dividing the measured critical electric current with the given area.

8. A test method according to claim 7; wherein the step of monitoring includes monitoring a varying electric current flowing through a plurality of spots in the sample insulating film to thereby obtain a statistical distribution of the critical electric current density.

9. A test method according to claim 8; wherein the step of determining includes determining the expected value of time to breakdown in the form of a mean time to breakdown according to the mean value of the statistical distribution of the critical electric current density.

10. A test method according to claim 9; wherein the step of determining includes determining the mean time to breakdown of an $SiO_2$ film according to the following relation: mean time to breakdown = $17.8 \times$ (mean value of the distribution of critical electric current density)$^{1.08}$.

* * * * *